(12) United States Patent
Li et al.

(10) Patent No.: US 9,413,364 B2
(45) Date of Patent: Aug. 9, 2016

(54) APPARATUS AND METHOD FOR CLOCK SYNCHRONIZATION FOR INTER-DIE SYNCHRONIZED DATA TRANSFER

(71) Applicant: Intel Corporation, Santa Clara, CA (US)

(72) Inventors: Shenggao Li, Pleasanton, CA (US); Stefan Rusu, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 40 days.

(21) Appl. No.: 14/326,788

(22) Filed: Jul. 9, 2014

(65) Prior Publication Data

US 2016/0013799 A1    Jan. 14, 2016

(51) Int. Cl.
| | |
|---|---|
| *H03L 7/00* | (2006.01) |
| *H03L 7/091* | (2006.01) |
| *H01L 23/48* | (2006.01) |
| *G06F 13/40* | (2006.01) |
| *H03L 7/07* | (2006.01) |
| *H03L 7/081* | (2006.01) |

(52) U.S. Cl.
CPC ............ *H03L 7/091* (2013.01); *G06F 13/4027* (2013.01); *H01L 23/481* (2013.01); *H03L 7/07* (2013.01); *H03L 7/0814* (2013.01); *H01L 2224/48137* (2013.01); *H01L 2224/49175* (2013.01)

(58) Field of Classification Search
CPC . G06F 13/4027; G06F 13/405; H01L 23/481; H03L 7/00; H03L 7/091; H04L 7/0008; H04L 7/0012; H04L 7/0016; H04L 7/002; H04L 7/0025; H04L 7/0033; H04L 7/0037

USPC ......... 327/141, 144, 146, 147, 155, 156, 231, 327/233–238, 243, 244, 254, 261, 564, 565
See application file for complete search history.

(56) References Cited

U.S. PATENT DOCUMENTS

| | | | | |
|---|---|---|---|---|
| 5,631,591 | A * | 5/1997 | Bar-Niv | G06F 1/10 327/12 |
| 6,470,458 | B1 * | 10/2002 | Dreps | G06F 1/10 713/1 |
| 7,126,986 | B2 * | 10/2006 | Dabral | G06F 1/12 375/226 |
| 7,256,628 | B2 * | 8/2007 | Drost | G06F 1/12 327/147 |
| 7,382,844 | B2 * | 6/2008 | Hwang | G06F 1/10 327/141 |
| 7,876,517 | B2 | 1/2011 | Buch et al. | |
| 8,674,736 | B2 | 3/2014 | Toda | |
| 2003/0081709 | A1 | 5/2003 | Ngo et al. | |
| 2004/0062332 | A1 * | 4/2004 | Dabral | G06F 1/12 375/373 |
| 2008/0111724 | A1 * | 5/2008 | Reial | H04B 1/7117 341/122 |
| 2010/0040183 | A1 * | 2/2010 | Berhanu | H04L 7/0012 375/356 |
| 2010/0329364 | A1 * | 12/2010 | Giombanco | H04B 1/16 375/258 |

OTHER PUBLICATIONS

Office Action and Search Report for Taiwan Patent Application No. 4117959 mailed May 27, 2016, 7 pages.

* cited by examiner

*Primary Examiner* — William Hernandez
(74) *Attorney, Agent, or Firm* — Green, Howard & Mughal LLP

(57) ABSTRACT

Described is an apparatus for clock synchronization. The apparatus comprises a pair of interconnects; a first die including a first phase interpolator having an output coupled to one of the interconnects; and a second die, wherein the pair of interconnects is to couple the first die to the second die.

23 Claims, 8 Drawing Sheets

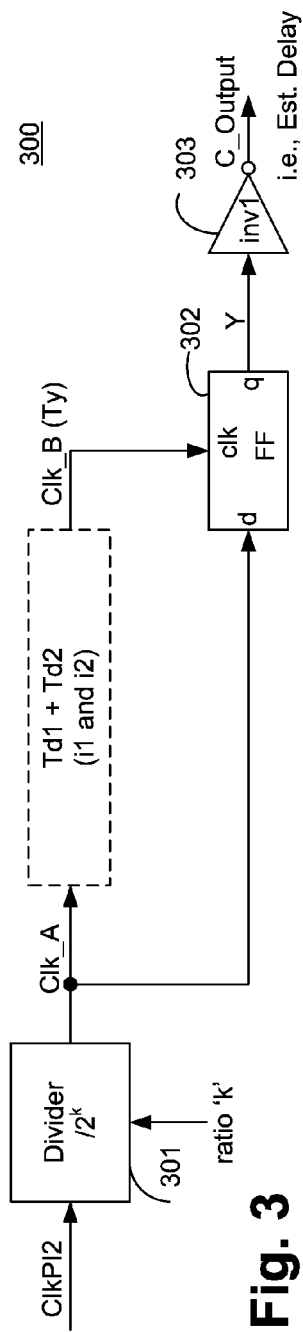
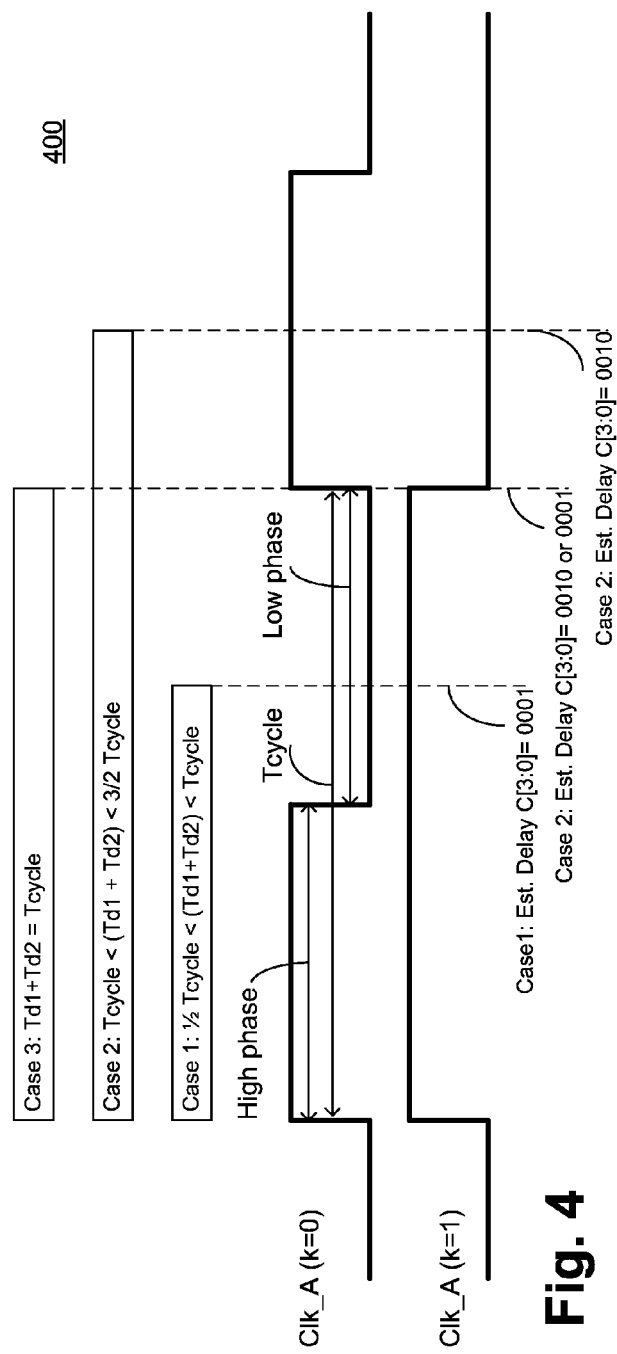

APPARATUS AND METHOD FOR CLOCK SYNCHRONIZATION FOR INTER-DIE SYNCHRONIZED DATA TRANSFER

BACKGROUND

Clock skew between multiple clock domains on the same die can be reduced using phase locked loops (PLLs) and skew compensators with delay lines. However, to reduce large clock skews (e.g., delay mismatch of 10's or 100's of picoseconds on typical CPU clock trees that might be operating at a few GHz frequency), the skew compensator itself can introduce several hundred picoseconds of delay which may introduce additional clock skew variation and supply noise induced jitter.

Multi-chip packaging (MCP) is used to consolidate multiple dies on a single package. To reduce clock skew between multiple dies, asynchronous clocking techniques may be used. Such techniques rely on pipelines such as first-in-first-out (FIFO) pipelines. For example, FIFO pipelines are used on clock domains on either side of the links between multiple dies. To cope with large clock skews, however, deeper (i.e., longer) FIFO pipeline depth is used which increases latency. An increase in latency reduces overall performance of the processor.

Delay matching techniques using delay-line based skew compensators, techniques used for skew reduction on a single die, are not suited for use in MCP because aligning clock edges at clock distribution ends of multiple clock domains on different dies is complicated and perhaps not feasible. The issues of traditional clock skew compensation discussed above with reference to MCPs are also applicable to three dimensional (3D) integrated circuit (IC) stacked dies.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 3 illustrates a delay estimator for use in the apparatus of FIG. 1, according to some embodiments of the disclosure.

FIG. 4 illustrates a timing diagram showing operation of the delay estimator of FIG. 3, according to some embodiments of the disclosure.

DETAILED DESCRIPTION

Figure 1A:
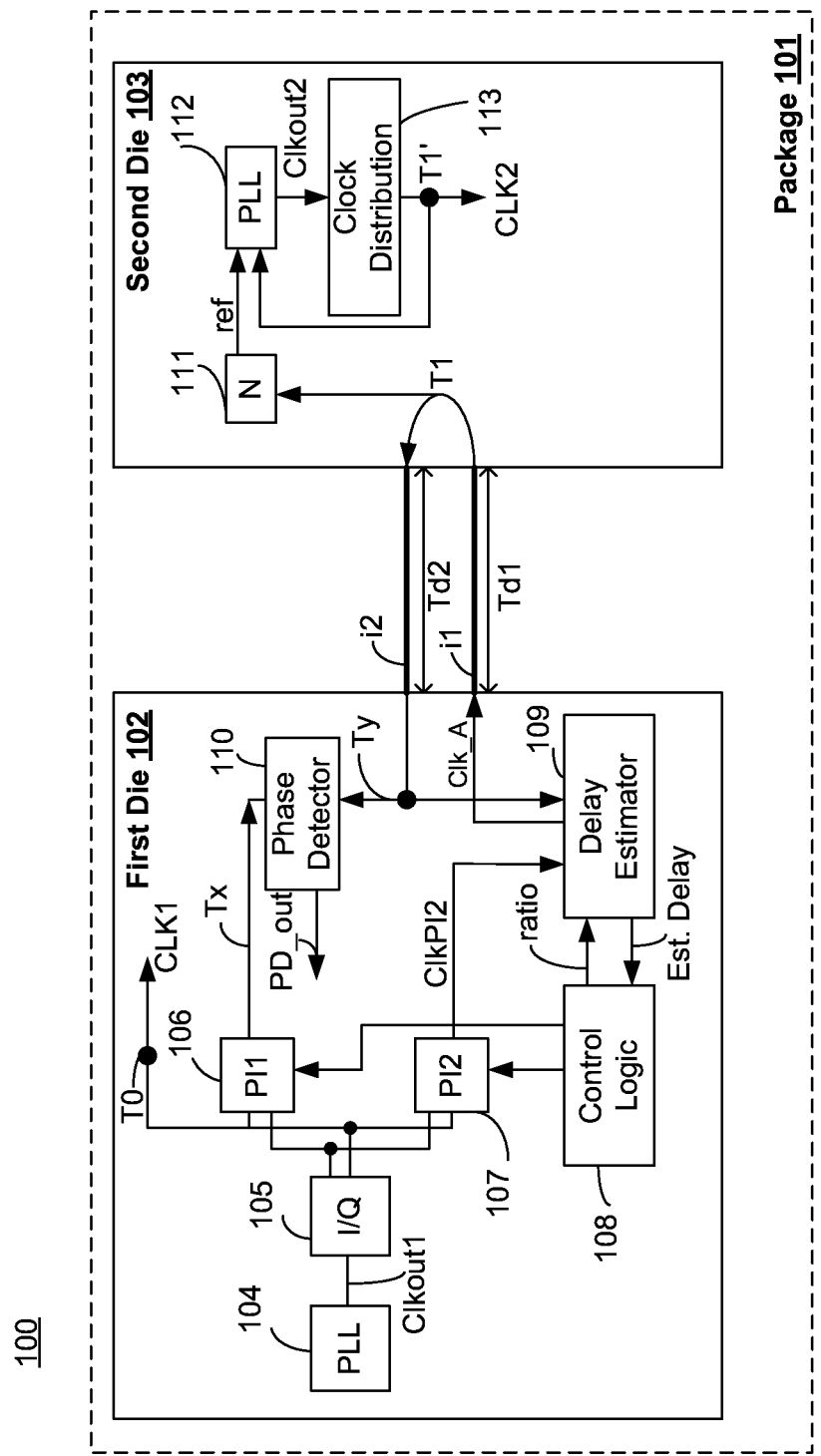
FIG. 1A illustrates an integrated circuit (IC) with a multi-die package having apparatus for clock synchronization for inter-die synchronized data transfer, according to some embodiments of the disclosure.

Some embodiments describe an apparatus for synchronizing clock edges of clock signals in MCP and/or 3D IC stacked dies that may either reduce the depth of FIFO pipelines traditionally used for clock synchronization or eliminate those FIFO pipelines altogether. In some embodiments, the apparatus for synchronizing clock edges of clock signals is positioned on one die (instead of multiple dies) for synchronizing the clock edges in that die and the clock edges in the other die(s). Here, synchronization generally refers to aligning transition edges of clock signals.

In some embodiments, the apparatus for synchronizing clock edges of clock signals comprises a pair of interconnects (e.g., through-silicon-vias or inter-die interconnects) which couples a first die with a second die. In some embodiments, the pair of interconnects have matched delays. In this embodiment, one of the interconnects of the pair is used for forward path (i.e., path from the first die to the second die) while the other interconnect of the pair is used for feedback path (i.e., path from the second die back to the first die). In some embodiments, the forward path and the feedback path have substantially the same delays i.e., matched delays.

In some embodiments, the first die (e.g., a processor die), which is part of the apparatus, includes at least two phase interpolators (PIs) such that output of one of the PIs is coupled to one of the interconnects of the pair of interconnects. In some embodiments, the first die further comprises a delay estimator coupled to the pair of interconnects. In some embodiments, the delay estimator is used to estimate or measure propagation delay at the first die starting from one of the interconnects of the pair to the second die and back to the first die via the other of the interconnects of the pair of interconnects. This estimated or measured delay (also referred here as Est. Delay) is the round trip delay from the first die to the second die and back to the first die.

In some embodiments, the apparatus further comprises control logic to control phase delay of the at least two PIs (i.e., first and second PIs) according to the estimated or measured propagation delay. In some embodiments, the control logic aligns the edge of a first clock signal generated by the first PI with the edge of a second clock signal generated by the second PI (or visa versa) after the second clock signal completes its round trip. In such an embodiment, the clock edge of the clock signal, which is input to the first and second PIs, is synchronized with the clock edge of the clock signal in the second die.

The apparatus of the embodiments can be used to synchronize clock edges across arbitrary number of dies of variable routing distances. While the embodiments are described with reference to an MCP and 3D IC stacked dies, the embodiments are also applicable for synchronizing clock edges on multiple ICs on a circuit board.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in the layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the logic blocks and circuits use metal oxide semiconductor (MOS) transistors, which include drain, source, gate, and bulk terminals. The transistors also include Tri-Gate and FinFET transistors, Gate All Around Cylindrical Transistors, Tunneling FET (TFET), Square Wire, or Rectangular Ribbon Transistors or other devices implementing transistor functionality like carbon nano tubes or spintronic devices. MOSFET symmetrical source and drain terminals i.e., are identical terminals and are interchangeably used here. A TFET device on the other hand has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1A illustrates an IC 100 with a multi-die Package 101 having apparatus for clock synchronization for inter-die synchronized data transfer, according to some embodiments of the disclosure. In some embodiments, Package 101 comprises a First Die 102 and a Second Die 103, which is coupled to First Die 102 by a pair of delay matched (or substantially delay matched) interconnects i1 and i2. In some embodiments, the interconnects i1 and i2 are through-silicon-vias (TSVs). In other embodiments, other types of inter-die interconnect technologies may be used for interconnects i1 and i2.

In some embodiments, First Die 102 comprises a phase locked loop (PLL), and an I/Q phase generator 105, where 'I' refers to in-phase and 'Q' refers to quadrature phase, and where 'I' and 'Q' phases are 90° apart. In some embodiments, PLL 104 generates a first main clock signal Clkout1 which is provided as input to I/Q phase generator 105. In some embodiments, I/Q phase generator 105 uses Clkout1 to generate clock signals with phases separated by 90°, one of which is CLK1 (clock 1). In some embodiments, First Die 102 further comprises a first PI 106 (i.e., PI1) and a second PI 107 (i.e., PI2), Control Logic 108, Delay Estimator 109, and Phase Detector 110. In some embodiments, Second Die 103 comprises a clock multiplier 111 to multiply incoming clock signal T1 by an integer 'N'; PLL 112, and Clock Distribution network 113. The output of Clock Distribution is CLK2 (clock 2) which is synchronized with CLK1 by the clock synchronizing apparatus in First Die 102.

In some embodiments, the output Tx of PI1 is received as an input by Phase Detector 110. In some embodiments, output ClkPI2 of PI2 is provided as input to Delay Estimator 109 which provides output as Clk_A to interconnect i1 which has a propagation delay of Td1. In some embodiments, ClkPI2 of PI2 is received by a divider which (when set to a divider ratio of 1) passes ClkPI2 as Clk_A to interconnect Td1. In some embodiments, interconnect i1 is coupled to interconnect i2 at Second Die 103 to form a feedback clock path such that interconnect i2 has a propagation delay of Td2 which is substantially equal or matched with the propagation delay Td1 of interconnect i1. In some embodiments, the output of interconnect i2 is Ty which is provided as input to Phase Detector 110. In some embodiments, Phase Detector 110 detects a phase difference between clock signals Tx and Ty and provides an output PD_out indicating the phase difference. When phases of Tx and Ty are aligned, clock signals CLK1 and CLK2 are synchronized.

In some embodiments, during training phase or at initialization (e.g., power-up of First and Second Dies 102 and 103) or other predetermined time points, Delay Estimator 109 divides down ClkPI2 and sends a clock signal Clk_A (i.e., divided version of ClkPI2) to interconnect i1 and receives that clock signal as Ty to estimate or measure propagation delay (i.e., Td1+Td2) or the round trip path. In some embodiments, the granularity of delay estimation is T/2, where 'T' is the clock cycle of clock signal Clk_A. In other embodiments, Delay Estimator 109 can have finer granularity for estimating propagation delay of interconnects i1 and i2. In some embodiments, the estimated delay (i.e., Est. Delay) is provided to Control logic 108. In some embodiments, Control Logic 108 updates a divider ratio 'k' for Delay Estimator 109 and analyzes the new Est. Delay based on the updated ratio 'k.' In some embodiments, divider ratio 'k' is updated several times and a code word for Est. Delay is determined. Some embodiments of Delay Estimator 109 are explained with reference to FIGS. 3-6.

Referring back to FIG. 1A, in some embodiments, Control Logic 108 uses the code word for Est. Delay to program PI1 and PI2 to align phases of clock signals Tx and Ty, respectively. In some embodiments, when PD_out changes polarity, CLK1 and CLK2 are synchronized. In such an embodiment, clock signal phases at node points T0 and T1 are synchronized (i.e., transition edges of clock signals at nodes T0 and T1 are matched). Note, names or labels for signals at a node and the node name is interchangeably used. For example, T1 may refer to signal at node T1 or node T1 depending on the context of the sentence. In some embodiments, PD_out is used for diagnostic purposes or by downstream logic and is not used by Control Logic 108 to program PI1 and PI2.

In some embodiments, Second Die 103 may use the synchronized clock at clock node T1 (which is synchronized with clock signal at node T0) to generate another clock signal CLK2 which is phase aligned to clock signal T1. In some embodiments, clock signal T1 is received by multiplier 111 that generates reference (ref) clock signal for PLL 112. In some embodiments, PLL 112 generates an output clock Clkout2 for distribution by Clock Distribution network 113. The output clock signal T1' of Clock Distribution 113 is phase aligned to ref (reference) clock signal. In some embodiments, when clock at node T1 (also referred here as clock signal T1) is matched with clock signal at node T0 (also referred here as clock signal T0), then clock signal at node T1' (also referred here as clock signal T1') is matched with clock signal at node T1 because PLL 112 phase aligns ref clock (which is a multiple of clock signal T1) with clock signal T1' (same as CLK2).

While some embodiments are described with reference to two dies (First Die 102 and Second Die 103), 'N' number of dies may be used in Package 101 and clock signals to each die can be synchronized with clock signal CLK1 of First Die 102. In some embodiments, subsequent dies (e.g., Third Die, Fourth Die, etc. (which are not shown)) can synchronize their respective clock signals to CLK1 in a cascaded fashion.

Figure 1B:
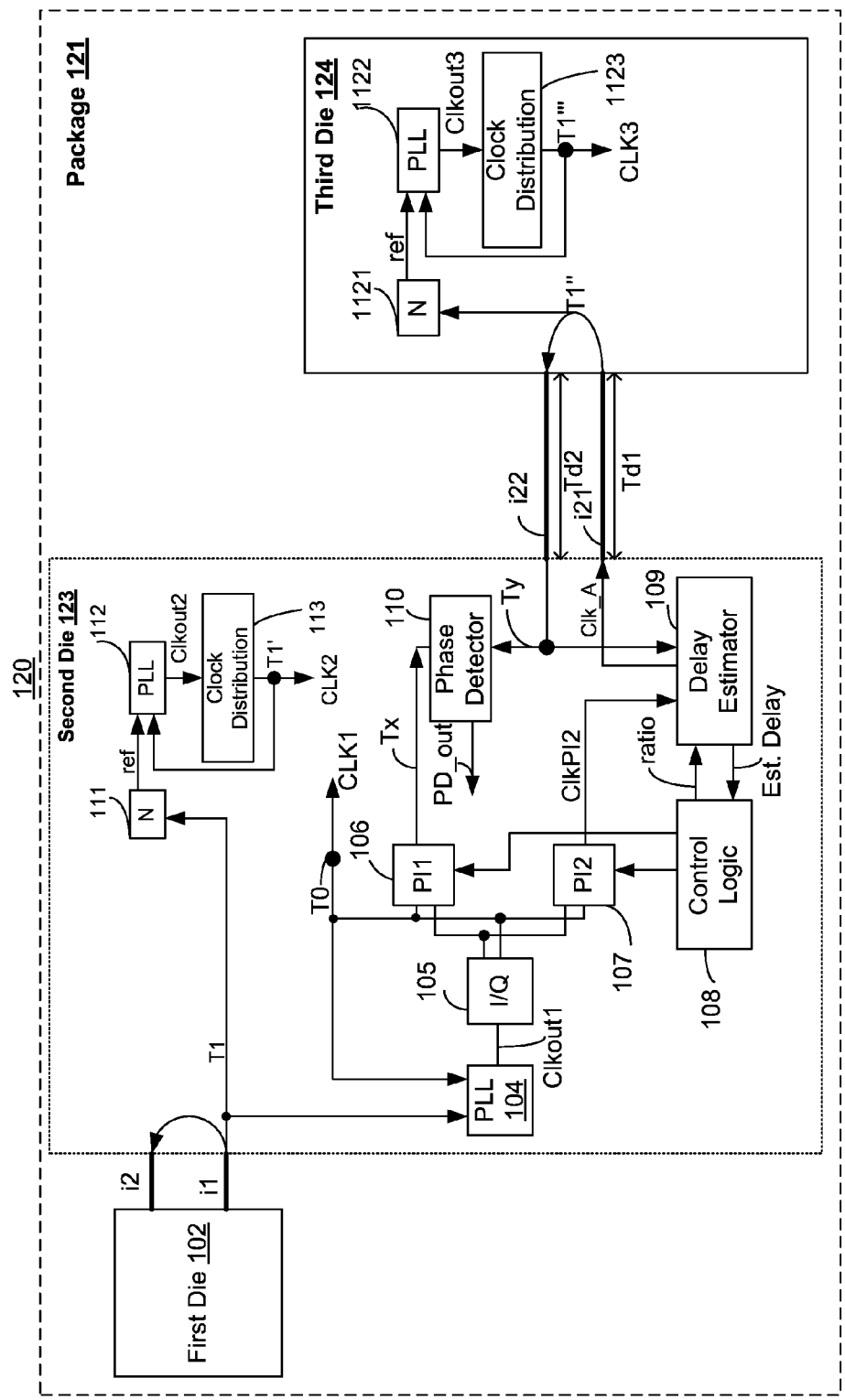
FIG. 1B illustrates an IC with a multi-die package having apparatus for clock synchronization for inter-die synchronized data transfer across multiple dies, according to some embodiments of the disclosure.

FIG. 1B illustrates an IC 120 with a multi-die Package 121 having apparatus for clock synchronization for inter-die synchronized data transfer across multiple dies, according to some embodiments of the disclosure. It is pointed out that those elements of FIG. 1B having the same reference numbers (or names) as the elements of any other figure can operate or function in any manner similar to that described, but are not limited to such. So as not to obscure the embodiments, differences between FIG. 1A and FIG. 1B are described.

In some embodiments, Package 121 includes First Die 102, Second Die 123, and Third Die 124. In some embodiments, First Die 102 is coupled to Second Die 123 by interconnects i1 and i2 while Second Die 123 is coupled to Third Die 124 by interconnects i22 and i21. While the example here shows interconnect i1 to have the same delay Td1 as interconnect i21, and interconnect i2 to have the same delay as Td2 as interconnect i22, the delays of interconnects i1/i2 and i21/i22 do not have to match but the delays of interconnects i21 and i22 should match to each other just as the delays of interconnects i1 and i2 match each other.

Here, Second Die 123 is similar to Second Die 103 but for additional apparatus for synchronizing clock signal CLK3 with clock signal CLK1 (and clock signal CLK2). In some embodiments, this apparatus for inter die clock synchronization is the same as the apparatus shown in First Die 102. In some embodiments, PLL 104 of Second Die 123 receives clock signal T1 as its reference clock and clock signal T0 (i.e., clock signal CLK1) as its feedback clock. As described with reference to FIG. 1A, Second Die 103 has transition edge of clock signal CLK2 synchronized to transition edge of clock signal CLK1 of First Die 102.

In some embodiments, Third Die 124 has a similar (but not required) clocking apparatus as of Second Die 102. For example, Third Die 124 includes multiplier 1121 (which provides reference clock), PLL 1122 (which generates output Clkout3), and Clock Distribution 1123. Output of Clock Distribution 123 is Clk3 which is synchronized to CLK2 of Second Die 103 (and hence synchronized to clock signal CLK1 of First Die 102) using the same method described with reference to FIG. 1A (i.e., transition edge of clock T'" is aligned to transition edge of clock T0 of Second Die 123, transition edge of clock T'" is aligned to transition edge of Clock T"). Likewise, Fourth Die (not shown) has its respective clock signal synchronized to clock signal CLK3 of Third Die 124 and thus synchronized to clock signal CLK1 of First Die 102, and so on.

Figure 2:
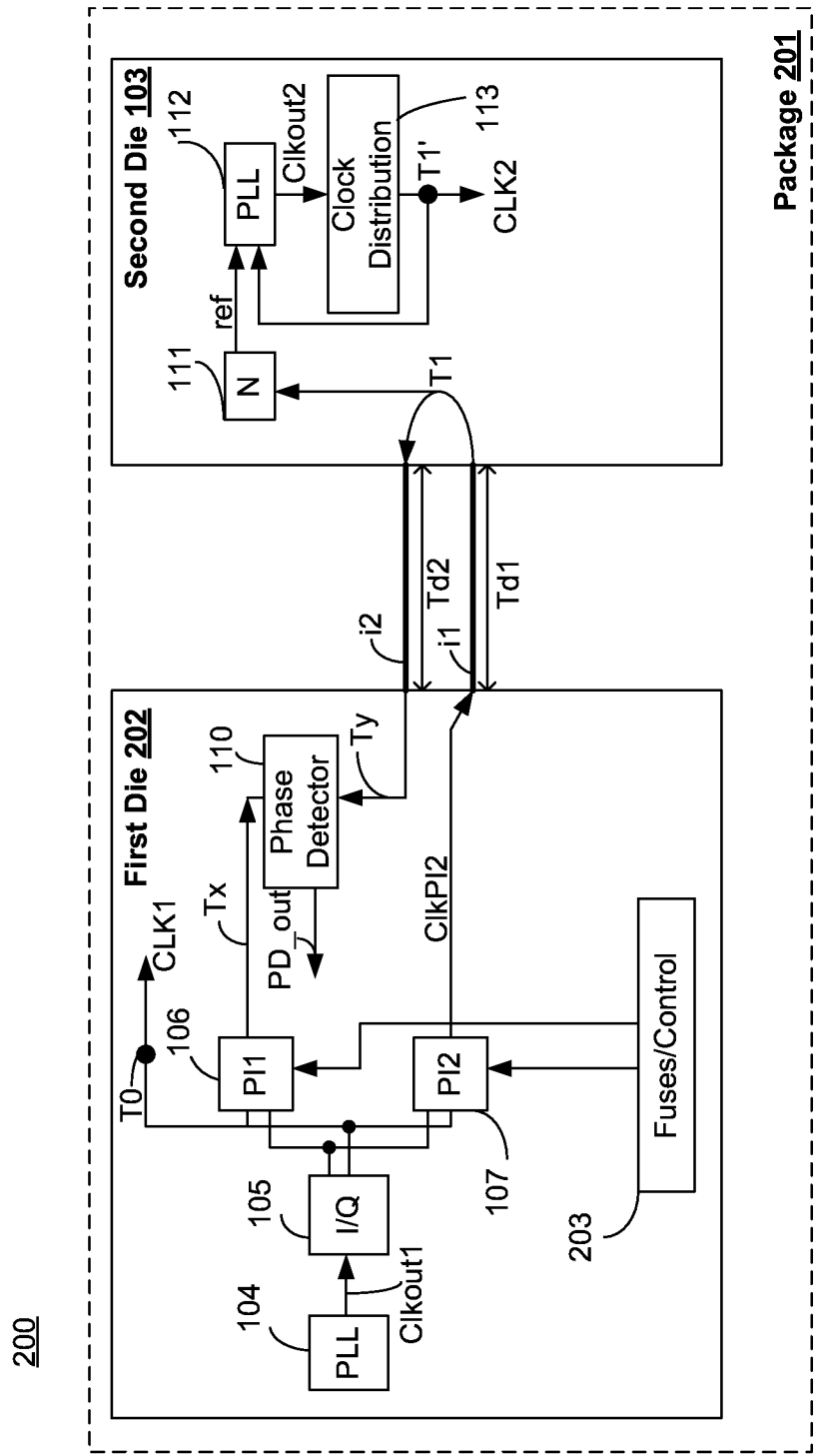
FIG. 2 illustrates an IC with a multi-die package having apparatus for clock synchronization for inter-die synchronized data transfer, according to other embodiments of the disclosure.

FIG. 2 illustrates an IC 200 with a multi-die Package 201 having apparatus for clock synchronization for inter-die synchronized data transfer, according to other embodiments of the disclosure. It is pointed out that those elements of FIG. 2 having the same reference numbers (or names) as the elements of any other figure can operate or function in any manner similar to that described, but are not limited to such. So as not to obscure the embodiments of FIG. 2, differences between FIG. 1 and FIG. 2 are described, and elements previously discussed are not discussed in detail again.

In this embodiment, IC 200 comprises Package 201 which includes First Die 202 without Delay Estimator 109 and associated Control Logic 108. In some embodiments, when propagation delays Td1 and Td2 of interconnects i1 and i2 are known (e.g., from pre-silicon simulations), then PI1 and PI2 can be pre-programmed by fuses or software (or other firmware means) to align clock edges at nodes T0 and T1.

FIG. 3 illustrates Delay Estimator 300 (e.g., Delay Estimator 109) for use in the apparatus of FIG. 1, according to some embodiments of the disclosure. It is pointed out that those elements of FIG. 3 having the same reference numbers (or names) as the elements of any other figure can operate or function in any manner similar to that described, but are not limited to such.

In some embodiments, Delay Estimator 300 comprises Divider 301, sequential unit 302, and inverter (or buffer) 303. In some embodiments, Divider 301 is a $2^k$ divider, where 'k' is an integer and also referred to here as ratio. Here, 'k' is a design parameter to account for realistic channel lengths of interconnects i1 and i2. In some embodiments, 'k' is provided by Control Logic 108. In some embodiments, Divider 301 receives input clock ClkPI2 and generates a divided down clock Clk_A according to divider ratio 'k'. While Divider 301 is shown as part of the Delay Estimator 109, Divider 301 can also be output side of Delay Estimator 109. In some embodiments, Clk_A is transmitted over interconnect i1 and back to First Die 102 via interconnect i2. Here, the clock signal received at the output of interconnect i2 at First Die 102 is Clk_B (same as Ty). Because of propagation delays of interconnects i1 and i2, a transition edge of Clk_B is delayed by delays of Td1 and Td2 relative to transition edge of Clk_A.

In some embodiments, sequential unit 302 is used to sample Clk_A (received as input data 'd') using Clk_B (which is received as clock input "clk"). In some embodiments, sequential unit 302 is an edge triggered flip-flop (FF). In other embodiments, other types of sequential units may be used for sequential unit 302. In some embodiments, output 'Y' of FF 302 is inverted by inverter inv1 303 to generate output C_Output (which is the Est. Delay associated with ratio 1'). In some embodiments, C_Output is determined for various values of 'k' (i.e., k=N, N−1, . . . 1, 0), and so a code word for various C_Output values (i.e., C[N:0]) is formed (i.e., C_Output for each 'k' is stored to form a vector C[N:0], where 'N' is an integer). In some embodiments, C[N:0] is a binary code which can be used to determine the approximate delay according to the expression below:

$$C = C_N * 2^N + C_{N-1} * 2^{N-1} + \ldots + C_1 * 2^1 + C_0 * 2^0 \quad (1)$$

-continued $$C * \frac{T_{cycle}}{2} \leq T_{d1+d2} \leq (C+1) * \frac{T_{cycle}}{2} \quad (2)$$

The above equation can be described with reference to an example using N=3. For instance, if round trip propagation delay "Td1+Td2" is smaller than half of the base clock period (i.e., Tcycle), then for various clock divider ratios (i.e., various values of 1'), the code word for C[N:0] will be 0000. Similarly, if round trip propagation delay "Td1+Td2" is more than half of Tcycle, but smaller than Tcycle, the resultant C[N:0] will be 0001.

In some embodiments, Est. Delay (i.e., C[N:0]) is generated and is inputted to Control Logic 108 to control the phase delays of PI1 and PI2. One reason for having Delay Estimator 300 is to identify situations when clock edges at nodes T1 and T0 are considered locked (i.e., phase aligned) but are actually misaligned by half-clock cycle. This case of false locking, and its remedy, is explained mathematically as follows with reference to FIG. 1A.

Assume the two PIs (i.e., PI1 and PI2), which are located on First Die 102, have a combined phase delay of 'T' (i.e., T(PI1)+T(PI2)=T, where 'T' is the clock cycle (i.e., Tcycle)). Also assume that T0 is the ideal clock edge at time zero, and that the edges of clock signals T1 and T0 are to be aligned to synchronize edges of clock signals CLK1 and CLK2. To achieve that goal (i.e., aligning positive (or rising) transition edges of clock signals T1 and T0), the two PIs (i.e., PIs 106 and 107) are controlled until phase detector 110 detects that edges of clock signals Tx and Ty are aligned. With the above assumptions, the following equations can be derived:

Circuit used PI2 107: $Ty=T0+T(PI2)+2*Td1$ (3)

Circuit used PI1 106: $Tx=T0+T(PI1)=T0+Tcycle-T(PI2)$ (4)

Circuit used Phase Detector 110: $Ty=Tx+n*Tcycle$ (5)

Substitute equations (3) and (4) into equation (5):

$T(PI2)+2*Td1=Tcycle-T(PI2)+n*Tcycle$ (6)

Rearrange equation (6):

$(T(PI2)+Td1)=[(n+1)/2]*Tcycle$ (7)

Note that T0+T(PI2)+Td1=T1:

$T1=T0+[(n+1)/2]*Tcycle$ (8)

where 'n' is an integer greater or equal to zero.

As shown from equation (8), when 'n' is odd, clock edges of clocks T1 and T0 are aligned. For example, when n=1, Ty=Tx+Tcycle which means edges of clock signals CLK1 and CLK2 are aligned (i.e., positive edge of CLK1 is aligned to positive edge of CLK2). However, when 'n' is an even number, edges of clock signals T1 and T0 may be out of phase (i.e., false locking–positive edge of CLK1 aligned to negative edge of CLK2).

For example, when n=0, T1=T0+0.5*Tcycle which falsely aligns edges of clock signals T1 and T0. In this example, edges of clock signals Tx and Ty are aligned (i.e., Ty=Tx) as indicated by PD_out, but edge of clock signal CLK2 is out of phase with edge of clock signal CLK1. When PD_out indicates that edge of clock signal Tx is early than edge of clock signal Ty, then Control Logic 108 causes PI1 to increase its delay to correct phase offset until edges of clock signals Tx and Ty are aligned. When PD_out indicates that edge of clock signal Tx is late than edge of clock signal Ty, then decreasing delay of PI1 may lead to false locking. The false locking is undesired and it leads to die-to-die communication malfunction. To resolve this false locking case, in some embodiments, round trip propagation delay (i.e., Td1+Td2) is estimated by Delay Estimator 109.

For cases where propagation delays Td1 and Td2 are known (as described with reference to FIG. 2), false locking case(s) can be avoided by programming PI1 and PI2 to align edges of clock signals T0 and T1. For cases where propagation delays Td1 and Td2 are not known a priori, then Delay Estimator 109 and Control Logic 108 are used to align edges of clock signals T0 and T1 to avoid the false locking case, according to one embodiment. In some embodiments, Control Logic 108 performs the following checks to initialize phase delay settings of PI1 and PI2 to avoid false locking.

For 'n' being greater than zero or equal to zero, when the round trip delay (i.e., Td1+Td2) is greater than 2n*Tcycle and less than (2n+1)*Tcycle, then in some embodiments, Control Logic 108 initializes the settings of PI1 to delay its output by phase 0° and initializes the setting for PI2 to delay its output by phase 360°. After initialization, Control Logic 108 increases phase delay of PI1 from 0° to 360° and decreases phase delay of PI2 from 360° to 0° until clock edges of clock signals Tx and Ty are aligned, according to one embodiment.

For 'n' being greater than zero or equal to zero, when the round trip delay (i.e., Td1+Td2) is greater than (2n+1)*Tcycle and less than (2n+2)*Tcycle, then in some embodiments, Control Logic 108 initializes the settings of PI1 to phase position of 0° and initializes the initial phase position of PI2 to 360°, which is effectively 0°. After initialization, Control Logic 108 directs PI2 to step phase position upward from 0° toward 360° and step phase position downward from 360° toward 0° until clock edges of clock signals Tx and Ty are aligned.

FIG. 4 illustrates a timing diagram 400 showing operation of Delay Estimator 300 of FIG. 3, according to some embodiments of the disclosure. It is pointed out that those elements of FIG. 4 having the same reference numbers (or names) as the elements of any other figure can operate or function in any manner similar to that described, but are not limited to such. Here, the x-axis is time and the y-axis for each waveform is voltage. Timing diagram 400 shows two waveforms of Clk_A when k=0 and k=1. Here, Tcycle is the period of ClkA having a 50% duty cycle with a High phase and Low phase. Three cases are analyzed here.

In case 1, the round trip propagation delay (i.e., Td1+Td2) is greater than half of Tcycle but less than Tcycle. In this case, Est. Delay for k=0, 1, 2, and 3 is 0001 i.e., C[3:0] is 0001. For example, when k=0, FF 302 samples Low phase of Clk_A to output Y=0, which is then inverted by inv1 303 to output C_Output as '1 (i.e., C[0]=1). Likewise, when k=1, FF 302 samples High phase of Clk_A to output Y=1, which is then inverted by inv1 303 to output C_Output as '0 (i.e., C[1]=0), and so on for other values of 'k'.

In case 2, the round trip propagation delay (i.e., Td1+Td2) is greater than Tcycle but less than 3/2 Tcycle. In this case, for k=0, 1, 2, and 3, Est. Delay is 0010 (i.e., C[3:0]=0010). For example, when k=0, FF 302 samples High phase of Clk_A to output Y=1, which is then inverted by inv1 303 to output C_Output as '0 (i.e., C[0]=0). Likewise, when k=1, FF 302 samples Low phase of Clk_A to output Y=0, which is then inverted by inv1 303 to output C_Output as '1 (i.e., C[1]=1), and so on for other values of 'k'.

In case 3, the round trip propagation delay (i.e., Td1+Td2) is equal to (or substantially equal to) Tcycle. In this case, for k=0, 1, 2, and 3, Est. Delay is 0010 or 0001 (i.e., C[3:0] is either 0010 or 0001). This is the meta-stable case because C[0] and C[1] can assume values of '0 or '1. To avoid this meta-stable case, in some embodiment, Control Logic 108 initializes the phase settings of PI1 and PI2 as discussed with reference to FIG. 3. In some embodiments, Delay Estimator 300 is modified (as shown with reference to FIG. 5) to identify the meta-stable case so that Control Logic 108 can take appropriate initialization steps for PI1 and PI2.

Figure 5:
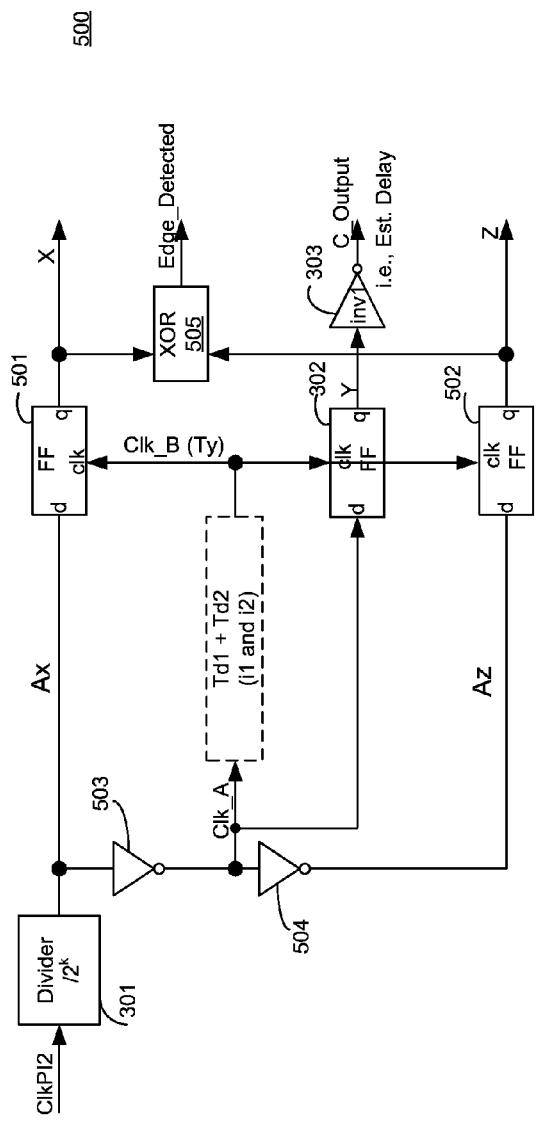
FIG. 5 illustrates a delay estimator for use in the apparatus of FIG. 1, according to other embodiments of the disclosure.

FIG. 5 illustrates a Delay Estimator 500 for use in the apparatus of FIG. 1, according to another embodiment of the disclosure. It is pointed out that those elements of FIG. 5 having the same reference numbers (or names) as the elements of any other figure can operate or function in any manner similar to that described, but are not limited to such. FIG. 5 is described with reference to FIG. 3. So as not to obscure the embodiments, elements of FIG. 3 are not discussed in detail again.

In some embodiments, Delay Estimator 500 comprises Divider 301, samplers (or flip-flops (FFs)) 501, 302, and 502, inverters 503, 504, and 303, and Exclusive-OR (XOR) gate 505 coupled together as shown. In some embodiments, output Ax of Divider 301 is sampled by FF 501 to generate output 'X'. In some embodiments, buffered output Az of Divider 301 (i.e., buffered by inverters 502 and 504) is sampled by FF 502 to generate output 'Z'. In some embodiments, outputs 'X' and 'Z' are received by XOR 505 that performs an XOR operation on signals 'X' and 'Z' to generate Edge_Detected signal. In some embodiments, output clock signal Clk_B (i.e., Ty) of interconnect i2 is used as sampling clock for FF 501, FF 302, and FF 502, where clock signal Clk_B is delayed version of clock signal Clk_A by delays Td1 and Td2.

In some embodiments, when transition edge of clock signal Clk_B samples near the transition edge of clock signal Clk_A, then 'X' and 'Z' outputs have opposite polarities. In some embodiments, XOR 505 is used for delay estimation. In some embodiments, when 'X' and 'Z' have opposite polarities, output of XOR 505 indicates that clock 'A' and clock 'B' transition edges are near each other. As such, the C[N:0] code is adjusted i.e., changed to some known values or else C[N:0] may be noisy or incorrect. In some embodiments, delays of inverters 503 and 504 are programmable delays which adjust the granularity of detecting the possible edge proximity.

Figure 6:
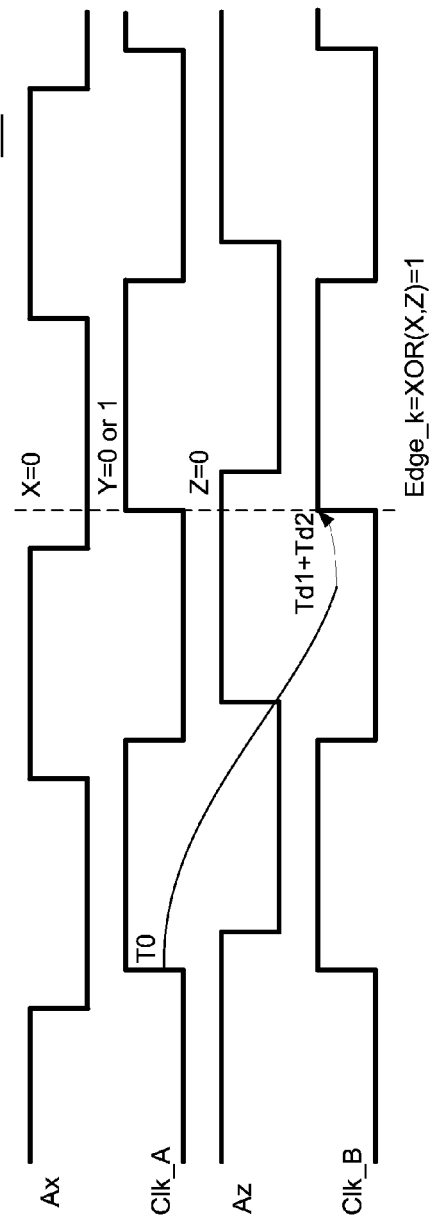
FIG. 6 illustrates a timing diagram showing operation of the delay estimator of FIG. 5, according to some embodiments of the disclosure.

FIG. 6 illustrates a timing diagram 600 showing operation of Delay Estimator 500 of FIG. 5, according to some embodiments of the disclosure. It is pointed out that those elements of FIG. 6 having the same reference numbers (or names) as the elements of any other figure can operate or function in any manner similar to that described, but are not limited to such.

Here, the x-axis is time and the y-axis for each waveform is voltage. The waveforms are clock signals Ax, Clk_A, Az, and Clk_B on nodes Ax, Clk_A, Az, and Clk_B, respectively. In some embodiments, Clk_B is the sampling clock for FFs 501, 302, and 502. With reference to T0, the dotted line shows the time point when clock signal Clk_B samples clock signals Ax, Clk_A, and Az using the respective FFs. If the transition edge of clock signal CLK_B (delayed version of CLK_A though interconnects i1 and i2) is near the transition edge of CLK_A, FF 302 may not be able to give a trustworthy output due to metal-stability or noise. However, because of the inverter delay given by inverters 503 and 504, clock signal CLK_B provided to FF 501 and FF 502 sample clock signals Ax and Az with opposite polarity (i.e., if CLK_A and CLK_B are too close to each other, XOR-gate will output a '1').

Figure 7:
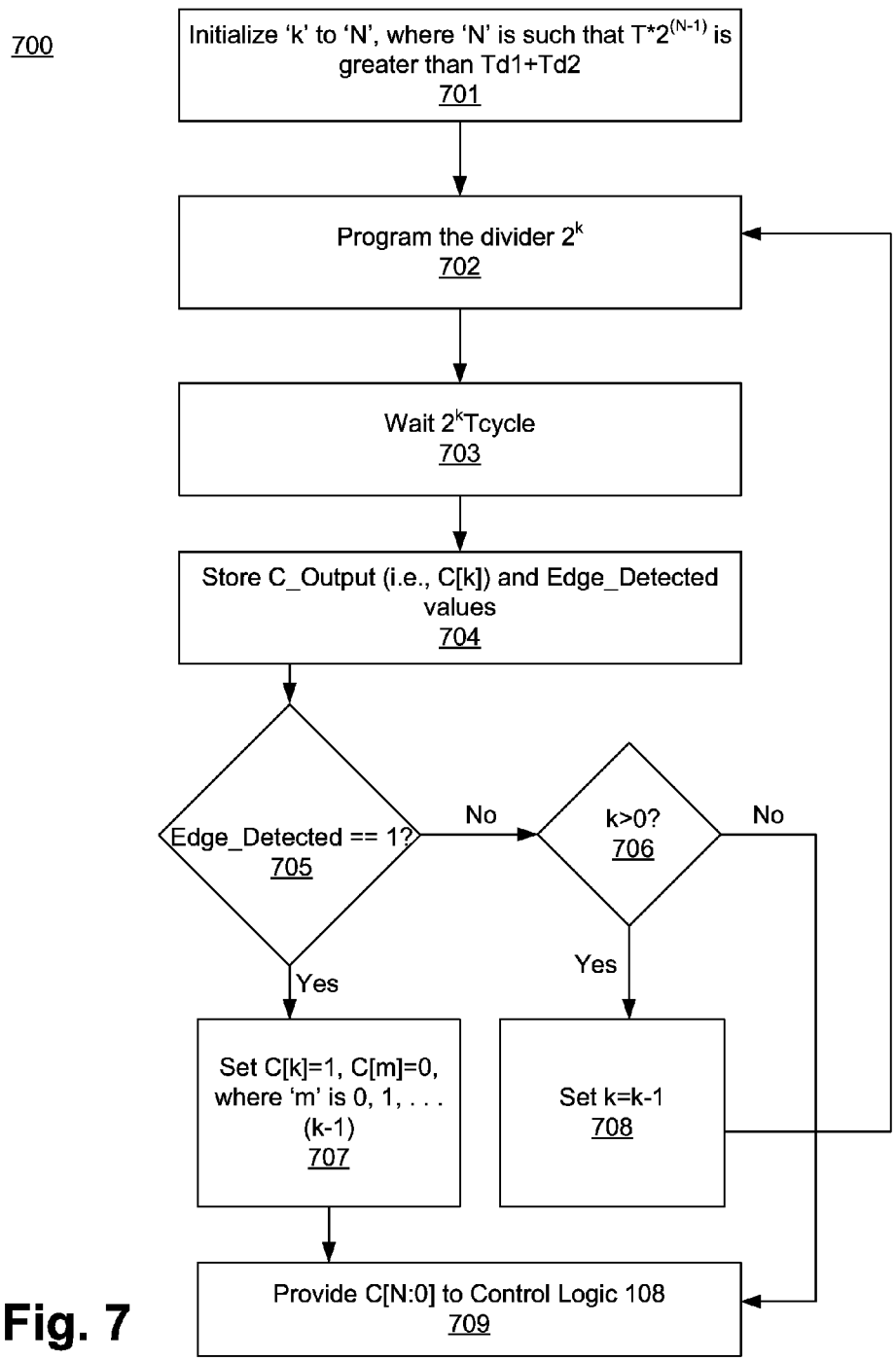
FIG. 7 illustrates a method of operation of the delay estimator of FIG. 5, according to some embodiments of the disclosure.

FIG. 7 illustrates a method 700 of operation of Delay Estimator 500 of FIG. 5, according to some embodiments of the disclosure. It is pointed out that those elements of FIG. 7 having the same reference numbers (or names) as the elements of any other figure can operate or function in any manner similar to that described, but are not limited to such.

Although the blocks in the flowchart with reference to FIG. 7 are shown in a particular order, the order of the actions can be modified. Thus, the illustrated embodiments can be performed in a different order, and some actions/blocks may be performed in parallel. Some of the blocks and/or operations listed in FIG. 7 are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 701, 'k' for Divider 301 is initialized to 'N' by Control Logic 108, where 'N' is such that $T*2^{(N-1)}$ is greater than Td1+Td2. At block 702, Divider 301 is programmed to divide ClkPI2 by $2^k$. At block 703, Control Logic 108 waits for $2^k*$Tcycle and then proceeds to block 704. At block 704, output of Delay Estimator 500 is stored. For example, outputs C_Output and Edge_Detected are stored by Control Logic 108 in memory. At block 705, a determination is made whether Edge_Detected is equal to 1.

If Edge_Detected is equal to 1, then at block 707 C[k] is set to 1 and C[m] is set to 0, where 'm' is the associated clock divider ratio setting as expressed in Delay Estimator 500. Here, C[m] refers to C[k−1], C[k−2] . . . C[1], C[0]. By setting C[k] and C[m] as such, the case when the edges are too close is avoided (i.e., issues with flop meta-stability are avoided). At block 709, the code word C[N:0] is provided to Control Logic 108. If Edge_Detected is not equal to zero, then the process proceeds to block 706. At block 706, a determination is made whether 'k' is greater than zero. If 'k' is greater than zero, then 'k' is decremented by 1 i.e., k=k−1. The method then proceeds to block 702. If a determination is made that 'k' is not greater than zero, then the process proceeds to block 709. After processing block 709, Control Logic 108 updates the phase settings of PI1 and PI2 to align CLK1 and CLK2 signals.

While method 700 is describe with reference to 'k' starting at 'N' and decrementing to zero, the method can be modified to start 'k' at zero and incrementing 'k' to 'N.' In such an embodiment, the conditional statements (e.g., operations of blocks 706 and 708) are modified.

When C[N:0] is determined by Delay Estimator 109, the delay range of the forward path (i.e., Td) is known, then phase settings of PI1 and PI2 can be derived to set the valid operating range, as follows. T(PI1)+T(PI2)=T, where 'T' is same as Tcycle; T(PI2)+(Td1+Td2)/2=n*T, where n=1, 2, 3, . . . . For a given estimate of Td=(Td1+Td2)/2, minimum and maximum settings for PI2 are determined by Control Logic 108 as:

$$PI2\_min = T - Td\_max - (\text{guard band}) = T - C[N:0]*T/4 - T/4 - (\text{guard band}) = 5T/8 - C[N:0]*T/4 \quad (9)$$

$$PI2\_max = T - Td\_min + (\text{guard band}) = T - C[N:0]*T/4 + (\text{guard band}) = 9T/8 + C[N:0]*T/4 \quad (10)$$

where guard band (e.g., T/8 is assumed for the above equations) is added to account for error in Delay Estimator 109 when Td is near T/4, T/2, and T, etc. Depending on the process technology and/or other factors, different values of guard band may be used. In some embodiments, by presetting PI2 to the minimum and maximum bounds, Control Logic 108 can step through the phase delays of PI2 (and PI1) until Tx and Ty are aligned, which eliminate the aforementioned false locking problem.

Table 1 shows the delay estimation code for presetting the range of PI1 and PI2 to eliminate alignment ambiguity caused by the false locking case. In some embodiments, valid phase delay range of PI2 overlaps with each other to account for jitter and FF sensitivity. For example, if PI2_min and PI2_max are drawn on a line, as C3 . . . 0 increases by 1, the line shifts a bit, and this new line overlaps with the previous line. This is just to say that the PI2 min/max regions for each code overlap with each other, so there is no way to miss any delay scenario.

TABLE 1

Code from Delay Estimator 109 used for presetting range of PI2

| C3 | C2 | C1 | C0 | Est. Delay Td1 + Td2 | | Td | | PI2 valid range (w +/− T/8 guard band) | | |
|---|---|---|---|---|---|---|---|---|---|---|
| | | | | min | max | Min | max | PI2_min | direction | PI2_max |
| 0 | 0 | 0 | 0 | 0 | T/2 | 0 | T/4 | 5T/8 | increase | 9T/8 |
| 0 | 0 | 0 | 1 | T/2 | T | T/4 | T/2 | 3T/8 | increase | 7T/8 |
| 0 | 0 | 1 | 0 | T | 3T/2 | T/2 | 3T/4 | T/8 | increase | 5T/8 |
| 0 | 0 | 1 | 1 | 3T/2 | 4T/2 | 3T/4 | 4T/4 | −T/8 | Increase | 3T/8 |
| 0 | 1 | 0 | 0 | 4T/3 | 5T/2 | 4T/4 | 5/2T | −3T/8 | increase | T/8 |
| ... | | | | | | | | | | |
| ... | | | | | | | | | | |

Table 1 provides an example of how C[N:0] code is determined based on estimated path delay Td. This C[N:0] code is used to set up the initial phase interpreter control code (PI2_min), its tuning direction, and its maximal control code. While Table 1 shows the PI2 code, PI1 code can be calculated using T(PI1)+T(PI2)=T.

Figure 8:
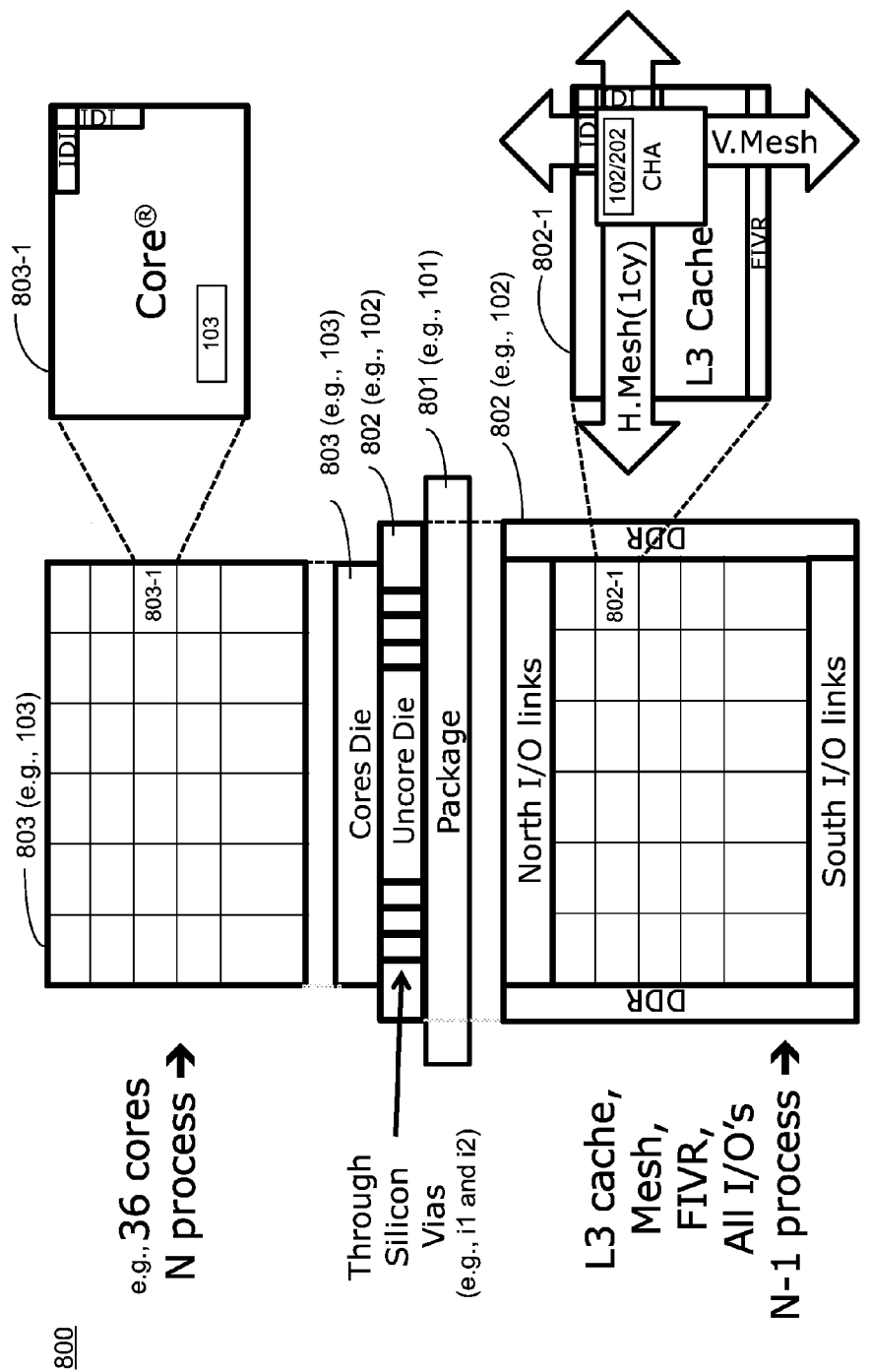
FIG. 8 illustrates a 3D IC stacked die with apparatus for clock synchronization for inter-die synchronized data transfer, according to some embodiments of the disclosure.

FIG. 8 illustrates a three dimensional (3D) stacked die 800 with apparatus for clock synchronization for inter-die synchronized data transfer, according to some embodiments of the disclosure. It is pointed out that those elements of FIG. 8 having the same reference numbers (or names) as the elements of any other figure can operate or function in any manner similar to that described, but are not limited to such.

In this embodiment, Package 801 (e.g., 101 or 201) packages Uncore Die 802 (e.g., First Fie 102) and Core Die 803 (e.g., Second Die 103). In some embodiments, interconnects i1 and i2 are TSVs. In some embodiments, Core Die 803 includes multiple cores (e.g., 36 cores). In some embodiments, each core may have a clocking circuit such as the one described with reference to Second Die 103. In some embodiments, Uncore Die 802 is on a different process node than Core Die 803. For example, Uncore Die is on a previous process (i.e., N−1 process node) while Core Die 803 is on the latest process node N. In such a case the clock synchronization apparatus described with reference to apparatus in First dies 102 and 202 is used to synchronize the clocks in Core Die 803 with clock in Uncore Die 802. The Uncore Die 802, may have many circuits. For example, Uncore Die 802 may have level-3 (L3) cache, clock mesh, fully integrated voltage regulator (FIVR), I/Os (i.e., input-output circuits such as DDR, North and South links on the periphery of the Uncore Die 802), etc.

Figure 9:
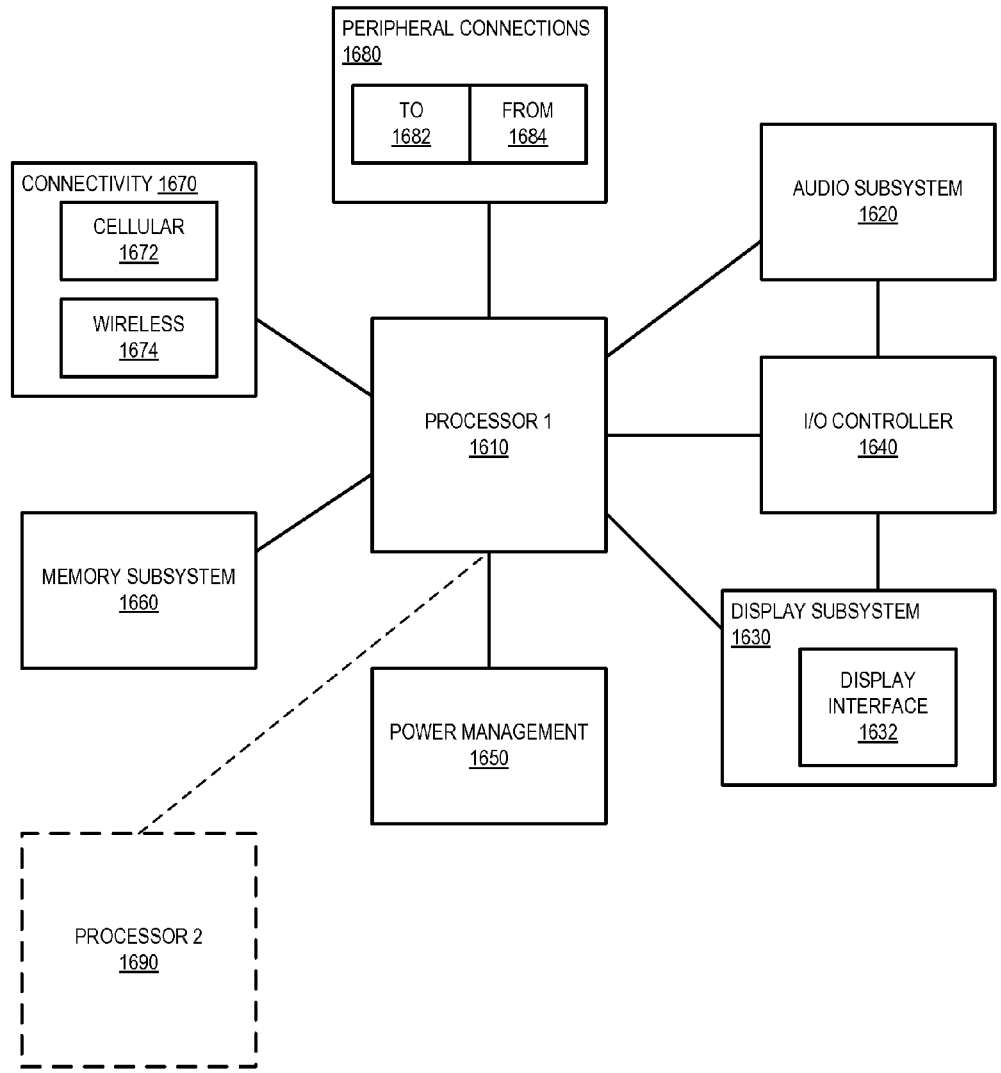
FIG. 9 illustrates is a smart device or a computer system or a SoC (System-on-Chip) with apparatus for clock synchronization for inter-die synchronized data transfer, according to some embodiments of the disclosure.

FIG. 9 illustrates a smart device or a computer system or a SoC (system-on-chip) in a multi-die or multi-chip package with apparatus for clock synchronization for inter-die synchronized data transfer, according to some embodiments of the disclosure. It is pointed out that those elements of FIG. 9 having the same reference numbers (or names) as the elements of any other figure can operate or function in any manner similar to that described, but are not limited to such.

FIG. 9 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes a first processor 1610 with apparatus for clock synchronization for inter-die synchronized data transfer, according to the embodiments discussed. Other blocks of the computing device 1600 may also include the apparatus for clock synchronization for inter-die synchronized data transfer as described in various embodiments. The various embodiments of the present disclosure may also comprise a network interface within 1670 such as a wireless interface so that a system embodiment may be incorporated into a wireless device, for example, cell phone or personal digital assistant.

In some embodiments, processor 1610 (and/or processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In some embodiments, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In some embodiments, display interface 1632 includes logic separate from processor 1610 to perform at least some processing related to the display. In some embodiments, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, a processor is provided which comprises: a pair of interconnects; a first die including: a first phase interpolator having an output coupled to one of the interconnects; and a delay estimator coupled to the pair of interconnects; and a second die, wherein the pair of interconnects is to couple the first die to the second die. In some embodiments, the delay estimator is operable to estimate or measure propagation delay at the first die starting from one of the interconnects of the pair to the second die and back to the first die via the other of the interconnects of the pair.

In some embodiments, the processor further comprises control logic to control phase delay of the first phase interpolator according to the estimated or measured propagation delay. In some embodiments, the processor further comprises a second phase interpolator, wherein the control logic to control phase delay of the second phase interpolator according to the estimated or measured propagation delay. In some embodiments, the first die further comprises a phase locked loop (PLL) to generate a clock signal.

In some embodiments, the control logic is operable to synchronize an edge of a clock signal in the second die with an edge of the clock signal in the first die generated by the PLL. In some embodiments, the first die comprises a phase generator to receive the clock signal from the PLL and to generate a signal of a first phase and a signal of a second phase for the phase interpolator. In some embodiments, the first die comprises a second phase interpolator to receive the signal of first and second phases and to provide an output for input to a phase detector.

In some embodiments, the delay estimator comprises: a divider to receive a clock signal and to provide a divided clock signal as input to one of the interconnects of the pair of interconnects. In some embodiments, the delay estimator comprises: a sequential logic to sample the divided clock signal by a delayed version of the divided clock signal, wherein the delayed version of the divided clock signal is received at the first die from the other interconnect of the pair of interconnects. In some embodiments, the sequential logic has an output indicating an estimate or measure of propagation delay. In some embodiments, the pair of interconnects is formed from through-silicon-vias (TSVs).

In another example, a system is provided which comprises: a multi-chip package having a processor according to the processor described above; a memory unit coupled to the multi-chip package; and a wireless interface communicatively coupled to the multi-chip package to allow one or more dies of the multi-chip package to communicate with another device. In some embodiments, the system further comprises: a display interface communicatively coupled to the multi-chip package.

In another example, a processor is provided which comprises: a pair of interconnects; a first die including at least two phase interpolators such that output of one of the phase interpolator is coupled to one of the interconnects of the pair of interconnects; and a second die, wherein the pair of interconnects is to couple the first die to the second die. In some embodiments, the first die further comprises a delay estimator coupled to the pair of interconnects.

In some embodiments, the delay estimator is operable to estimate or measure propagation delay at the first die starting from one of the interconnects of the pair to the second die and back to the first die via the other of the interconnects of the pair of interconnects. In some embodiments, the processor further comprises control logic to control phase delays of the at least two phase interpolators according to the estimated or measured propagation delay. In some embodiments, the first die further comprises a phase locked loop (PLL) to generate a clock signal.

In some embodiments, the control logic is operable to synchronize an edge of a clock signal in the second die with an edge of the clock signal in the first die generated by the PLL. In some embodiments, the first die further comprises a phase generator to receive the clock signal from the PLL and to generate a signal of a first phase and a signal of a second phase for the at least two phase interpolators.

In some embodiments, the processor comprises a divider to receive a clock signal and to provide a divided clock signal as input to one of the interconnects of the pair of interconnects. In some embodiments, the delay estimator comprises: a sequential logic to sample the divided clock signal by a delayed version of the divided clock signal. In some embodiments, the delayed version of the divided clock signal is received at the first die from the other interconnect of the pair of interconnects. In some embodiments, the sequential logic has an output indicating an estimate or measure of propagation delay. In some embodiments, the pair of interconnects is formed from through-silicon-vias (TSVs).

In another example, a system is provided which comprises: a multi-chip package comprising a processor according to the processor described above; and a wireless interface communicatively coupled to the multi-chip package to allow one or more dies of the multi-chip package to communicate with another device. In some embodiments, the system further comprises a display interface communicatively coupled to the multi-chip package.

In another example, an apparatus is provided which comprises: a pair of interconnects; a first die including: a phase detector; a first phase interpolator to receive a clock signal and to provide a first output to the phase detector; a second phase interpolator to receive the clock signal and to provide an output for one of the interconnects of the pair of interconnects, wherein the other interconnect of the pair of interconnects is to provide a second output to the phase detector; and a second die coupled to the first die by the pair of interconnects.

In some embodiments, the first die further comprises: a delay estimator to estimate or measure propagation delay at the first die starting from one of the interconnects of the pair to the second die and back to the first die via the other of the interconnects of the pair of interconnects. In some embodiments, the first die further comprises: a control logic to control phase delay of the at least two phase interpolators according to the estimated or measured propagation delay such that an edge of a clock signal in the second die is synchronized with an edge of the clock signal of the first die.

In some embodiments, the first die further comprises: a delay estimator to estimate or measure roundtrip propagation delay through first and second interconnects; and a control logic to control phase delay of the at least two phase interpolators according to the estimated or measured propagation delay.

In some embodiments, the first die further comprises a phase locked loop (PLL) to generate a clock signal. In some embodiments, the control logic is operable to synchronize an edge of a clock signal in the second die with an edge of the clock signal in the first die generated by the PLL. In some embodiments, the first die further comprises a phase generator to receive the clock signal from the PLL and to generate a signal of a first phase and a signal of a second phase for the first and second phase interpolators. In some embodiments, the pair of interconnects is formed from through-silicon-vias (TSVs).

In another example, a system is provided which comprises: a multi-chip package comprising an apparatus according to the apparatus described above; a memory unit coupled to the multi-chip package; and a wireless interface communicatively coupled to the multi-chip package to allow one or more dies of the multi-chip package to communicate with another device. In some embodiments, the system further comprises a display interface communicatively coupled to the multi-chip package.

In another example, a method is provided which comprises: receiving an input clock signal and generating a first and second clock signal by first and second phase interpolators respectively; dividing the second clock signal to generate a divided clock signal; providing the divided clock signal to a first interconnect of a pair of interconnects, the first interconnect coupling a first die to a second die and providing the divided clock signal to the second die; receiving from the second die, via a second interconnect of the pair of interconnects, a delayed clock signal which is a delayed version of the divided clock signal; estimating propagation delay of the first and second interconnects using the delayed clock signal; and controlling the phase adjustment of the first and second phase interpolators such that transition edge of the input clock signal is substantially aligned to a transition edge of the divided clock signal at the second die.

In some embodiments, the method further comprises: initializing a divider ratio 'k' of a divider to 'N', where 'N' is an integer; and receiving, by the divider, the second clock signal, wherein the divider to divide the second clock signal by $2^k$ to generate the divided clock signal. In some embodiments, the estimated propagation delay is a digital code.

In another example, an apparatus is provided which comprises: means for receiving an input clock signal and generating a first and second clock signal by first and second phase interpolators respectively; means for dividing the second clock signal to generate a divided clock signal; means for providing the divided clock signal to a first interconnect of a pair of interconnects, the first interconnect coupling a first die to a second die and providing the divided clock signal to the second die; means for receiving from the second die, via a second interconnect of the pair of interconnects, a delayed clock signal which is a delayed version of the divided clock signal; means for estimating propagation delay of the first and second interconnects using the delayed clock signal; and means for controlling the phase adjustment of the first and second phase interpolators such that transition edge of the input clock signal is substantially aligned to a transition edge of the divided clock signal at the second die.

In some embodiments, the apparatus further comprises: means for initializing a divider ratio 'k' of a divider to 'N', where 'N' is an integer; and means for receiving, by the divider, the second clock signal, wherein the divider to divide the second clock signal by $2^k$ to generate the divided clock signal. In some embodiments, the estimated propagation delay is a digital code.

In another example, a system is provided which comprises: a multi-chip package comprising an apparatus according to the apparatus described above; a memory unit coupled to the multi-chip package; and a wireless interface communicatively coupled to the multi-chip package to allow one or more dies of the multi-chip package to communicate with another device. In some embodiments, the system further comprises a display interface communicatively coupled to the multi-chip package.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. A processor comprising:
a pair of interconnects;
a first die including:
a first phase interpolator having an output coupled to one of the interconnects; and
a delay estimator coupled to the pair of interconnects; and
a second die, wherein the pair of interconnects is to couple the first die to the second die.

2. The processor of claim 1, wherein the delay estimator is operable to estimate or measure propagation delay at the first die starting from one of the interconnects of the pair to the second die and back to the first die via the other of the interconnects of the pair.

3. The processor of claim 2 further comprises control logic to control phase delay of the first phase interpolator according to the estimated or measured propagation delay.

4. The processor of claim 3 further comprises a second phase interpolator, wherein the control logic is to control phase delay of the second phase interpolator according to the estimated or measured propagation delay.

5. The processor of claim 4, wherein the first die further comprises a phase locked loop (PLL) to generate a clock signal.

6. The processor of claim 5, wherein the control logic is operable to synchronize an edge of a clock signal in the second die with an edge of the clock signal in the first die generated by the PLL.

7. The processor of claim 5, wherein the first die comprises a first phase generator to receive the clock signal from the PLL and to generate a signal of a first phase and a signal of a second phase for the first phase interpolator.

8. The processor of claim 7, wherein the first die comprises a second phase interpolator to receive the signals of first and second phases and to provide an output for input to a phase detector.

9. The processor of claim 2, wherein the delay estimator comprises:

a divider to receive a clock signal and to provide a divided clock signal as input to one of the interconnects of the pair of interconnects.

10. The processor of claim 9, wherein the delay estimator comprises:
a sequential logic to sample the divided clock signal by a delayed version of the divided clock signal, wherein the delayed version of the divided clock signal is to be received at the first die from the other interconnect of the pair of interconnects.

11. The processor of claim 10, wherein the sequential logic has an output indicating an estimate or measure of propagation delay.

12. The processor of claim 1, wherein the pair of interconnects is formed from through-silicon-vias (TSVs).

13. A system comprising:
a multi-chip package comprising:
a pair of interconnects;
a first die including:
a first phase interpolator having an output coupled to one of the interconnects; and
a delay estimator coupled to the pair of interconnects; and
a second die, wherein the pair of interconnects is to couple the first die to the second die; and
a memory unit coupled to the multi-chip package; and
a wireless interface communicatively coupled to the multi-chip package to allow one or more dies of the multi-chip package to communicate with another device.

14. The system of claim 13 further comprises a display interface communicatively coupled to the multi-chip package.

15. The system of claim 13, wherein the delay estimator is operable to estimate or measure propagation delay at the first die starting from one of the interconnects of the pair to the second die and back to the first die via the other of the interconnects of the pair of interconnects.

16. The system of claim 15, wherein the first die comprises control logic to control phase delay of the first phase interpolator according to the estimated or measured propagation delay.

17. The system of claim 16, wherein the first die comprises a second phase interpolator, and wherein the control logic is to control phase delay of the second phase interpolator according to the estimated or measured propagation delay.

18. The system of claim 14, wherein the first die comprises a phase locked loop (PLL) to generate a clock signal.

19. An apparatus comprising:
a pair of interconnects;
a first die including:
a phase detector;
a first phase interpolator to receive a clock signal and to provide a first output to the phase detector; and
a second phase interpolator to receive the clock signal and to provide an output for one of the interconnects of the pair of interconnects, wherein the other interconnect of the pair of interconnects is to provide a second output to the phase detector; and
a second die coupled to the first die by the pair of interconnects.

20. The apparatus of claim 19, wherein the first die comprises:
a delay estimator which is to estimate or measure round trip propagation delay through the pair of interconnects; and
a control logic which is to control phase delay of the first and second phase interpolators according to the estimated or measured round trip propagation delay.

21. An apparatus comprising:
a first phase interpolator;
a delay estimator to be coupled to first and second interconnects and to the first phase interpolator, wherein the delay estimator is to generate an output according to an estimate of a propagation delay of the first and second interconnects; and
a control logic coupled to the first phase interpolator and to the delay estimator, wherein the control logic is to cause the first phase interpolator to adjust a parameter according to the output of the delay estimator.

22. The apparatus of claim 21 comprises a second phase interpolator coupled to the control logic.

23. The apparatus of claim 22 comprises a phase locked loop (PLL) to provide a clock signal for the first and second phase interpolators.

* * * * *